(12) United States Patent
Go et al.

(10) Patent No.: US 12,293,807 B2
(45) Date of Patent: May 6, 2025

(54) OFFSET CALIBRATION TRAINING METHOD FOR ADJUSTING DATA RECEIVER OFFSET AND MEMORY DEVICE THEREFOR

(71) Applicant: Samsung Electronics Co., Ltd., Suwon-si (KR)

(72) Inventors: Younggil Go, Suwon-si (KR); Hundae Choi, Suwon-si (KR); Yoochang Sung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 138 days.

(21) Appl. No.: 18/347,641

(22) Filed: Jul. 6, 2023

(65) Prior Publication Data

US 2024/0029768 A1    Jan. 25, 2024

(30) Foreign Application Priority Data

Jul. 22, 2022 (KR) .................. 10-2022-0091325
Nov. 22, 2022 (KR) .................. 10-2022-0157513

(51) Int. Cl.
*G11C 7/10* (2006.01)
*G11C 7/08* (2006.01)
*G11C 7/22* (2006.01)

(52) U.S. Cl.
CPC .............. *G11C 7/1093* (2013.01); *G11C 7/08* (2013.01); *G11C 7/1084* (2013.01); *G11C 7/222* (2013.01)

(58) Field of Classification Search
CPC ................................ G11C 7/1093; G11C 7/10
USPC ....................................................... 365/233.1
See application file for complete search history.

(56) References Cited

U.S. PATENT DOCUMENTS

| | | | |
|---|---|---|---|
| 7,376,857 B2 | 5/2008 | Lee et al. | |
| 7,554,844 B2 | 6/2009 | Werner et al. | |
| 10,600,459 B2* | 3/2020 | Kim | ..................... G11C 7/1063 |
| 10,923,175 B2* | 2/2021 | Moon | ................... G06F 3/0659 |
| 11,212,069 B2 | 12/2021 | Lee et al. | |
| 2018/0203067 A1 | 7/2018 | Chen | |
| 2021/0075428 A1 | 3/2021 | Takai et al. | |
| 2022/0011809 A1 | 1/2022 | Asaki et al. | |
| 2023/0005515 A1* | 1/2023 | Kim | ................. G11C 29/50012 |

FOREIGN PATENT DOCUMENTS

KR           101191054 B1       10/2012

* cited by examiner

*Primary Examiner* — Muna A Techane
(74) *Attorney, Agent, or Firm* — Myers Bigel, P.A.

(57) ABSTRACT

An offset calibration training method for adjusting a data receiver offset and a memory device therefor are provided. A method of performing a data receiver offset calibration includes storing a first parameter code, which is used to set a default data receiver offset calibration for the data receiver offset calibration, in a mode register, storing a second parameter code, which is used to set an optional data receiver offset calibration for the data receiver offset calibration, in the mode register, training the default data receiver offset calibration based on the first parameter code for the data receiver offset calibration, and training the optional data receiver offset calibration based on the second parameter code for the data receiver offset calibration.

20 Claims, 10 Drawing Sheets

OFFSET CALIBRATION TRAINING METHOD FOR ADJUSTING DATA RECEIVER OFFSET AND MEMORY DEVICE THEREFOR

CROSS-REFERENCE TO RELATED APPLICATIONS

This application is based on and claims priority under 35 U.S.C. § 119 to Korean Patent Application Nos. 10-2022-0091325, filed on Jul. 22, 2022, and 10-2022-0157513, filed on Nov. 22, 2022, in the Korean Intellectual Property Office, the disclosures of which are incorporated by reference herein in their entirety.

BACKGROUND

The inventive concept relates to a memory device, and more particularly, to an offset calibration training method for adjusting a data receiver offset and a memory device therefor.

With the increasing demand for high speed, large data capacity, and low power consumption of electronic systems, semiconductor memory that may be accessed faster and may store more data and use less power has been continuously developed. Semiconductor memory is usually controlled by providing commands, addresses, and clock signals to memory devices. Various commands, addresses, and clock signals may be provided by, for example, memory controllers. Commands may control memory devices to perform various memory operations, e.g., a read operation for retrieving data from a memory device and a write operation for storing data in a memory device. Data associated with a command may be provided between a memory controller and a memory device at a known timing in relation with reception and/or transmission by the memory device.

External clock signals, such as a system clock signal and a data clock signal, may be provided to a memory device by a memory controller. The system clock signal may be used for the timings of commands and addresses, and the data clock signal may be used for a data write timing provided to the memory device and a data read timing provided by the memory device. The memory device may provide the memory controller with a data clock signal for timing the transmission of data to the memory controller. The frequency of a data clock signal may be higher than the frequency of a system clock signal. For example, the frequency of a data clock signal may be integer multiples of a system clock signal frequency.

An external clock signal provided to a memory device may be used to generate an internal clock signal for controlling timings of various internal circuits during a memory operation. During a memory operation, timings of internal circuits may be important, and a timing deviation of a clock signal may cause a malfunction. A memory controller may perform memory training with respect to parameters associated with an interface with the memory device. For example, memory training may be performed with respect to impedance adjustment (ZQ) calibration, clock training, write leveling, data receiver offset calibration, and/or the like.

SUMMARY

The inventive concept provides an offset calibration training method for adjusting a data receiver offset and a memory device therefor.

According to aspects of the inventive concept, there is provided a method of performing a data receiver offset calibration of a memory device. The method includes storing a first parameter code in a mode register, the first parameter code being used to set a default data receiver offset calibration for the data receiver offset calibration, storing a second parameter code in the mode register, the second parameter code being used to set an optional data receiver offset calibration for the data receiver offset calibration, training the default data receiver offset calibration based on the first parameter code for the data receiver offset calibration, and training the optional data receiver offset calibration based on the second parameter code for the data receiver offset calibration.

According to aspects of the inventive concept, there is provided a memory device including a mode register configured to store one of a first parameter code or a second parameter code for a data receiver offset calibration, wherein the first parameter code is used to set a default data receiver offset calibration, and the second parameter code is used to set an optional data receiver offset calibration, and an internal clock generator that includes an oscillator configured to generate an oscillator signal, wherein the memory device is configured to perform the default data receiver offset calibration by using a write data clock signal and perform the optional data receiver offset calibration by using the oscillator signal.

According to aspects of the inventive concept, there is provided a method of performing a data receiver offset calibration of a memory device. The method includes storing a first parameter code in a mode register, the first parameter code being used to set a default data receiver offset calibration using a write data clock signal for the data receiver offset calibration, storing a second parameter code in the mode register, the second parameter code being used to set an optional data receiver offset calibration using an oscillator signal for the data receiver offset calibration, the oscillator signal having a lower clock frequency than the write data clock signal, training the default data receiver offset calibration based on the first parameter code for the data receiver offset calibration, and training the optional data receiver offset calibration based on the second parameter code for the data receiver offset calibration.

BRIEF DESCRIPTION OF THE DRAWINGS

Example embodiments will be more clearly understood from the following detailed description taken in conjunction with the accompanying drawings in which.

DETAILED DESCRIPTION

Data receiver offset calibration training performed between a memory controller and a memory device may use a data clock signal toggling at a full rate of several thousands of Mbps. A sense amplifier-based flip-flop (SAFF) included in a data receiver may not have a sufficient voltage development time for a sensing operation because of a high-speed data clock signal, and accordingly, the output of the SAFF may not be normally output. In addition, because kickback noise occurs in an input stage of the SAFF, it is difficult to adjust offset calibration. Therefore, a training method for allowing a data receiver offset calibration to be easily adjusted and a memory device therefor are desired.

Figure 1:
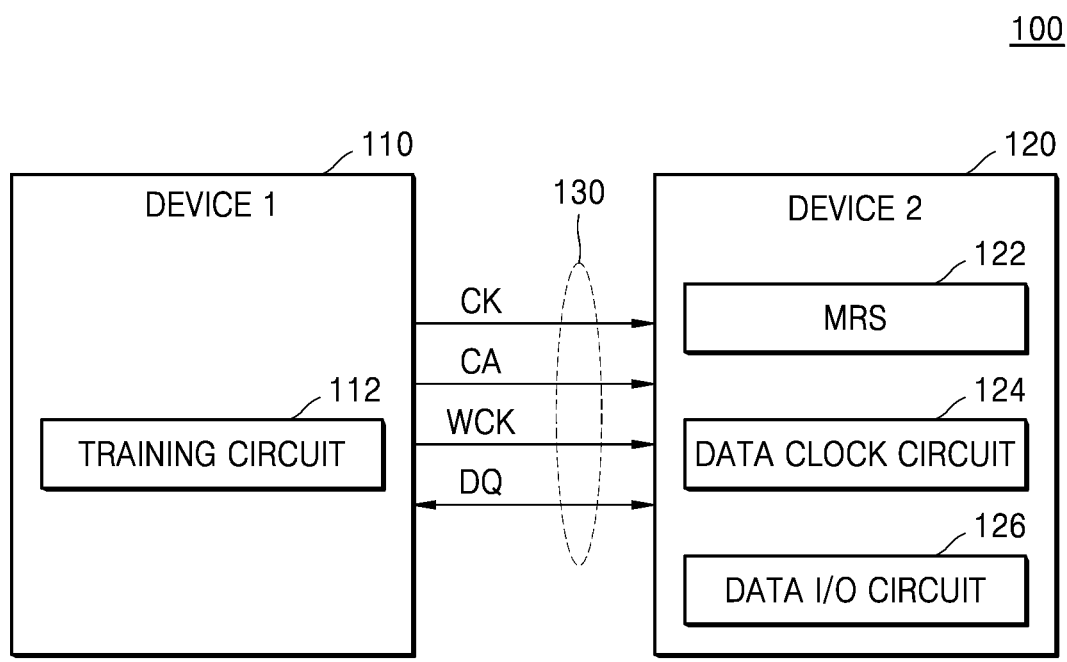
FIG. 1 is a block diagram of an apparatus according to some embodiments.

FIG. 1 is a block diagram of an apparatus according to some embodiments.

Referring to FIG. 1, an apparatus 100 may include a first device 110 and a second device 120. The apparatus 100 may be included in a personal computer (PC) or a mobile electronic device. The mobile electronic device may include a laptop computer, a mobile phone, a smartphone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile Internet device (MID), a wearable computer, an Internet of things (IoT) device, an Internet of everything (IoE) device, or a drone.

The first device 110 may include an integrated circuit (IC), a system-on-chip (SoC), an application processor (AP), a mobile AP, a chipset, or a set of chips. For example, the first device 110 may correspond to a semiconductor device performing a memory control function and may be included in an AP. The AP may include a memory controller, random access memory (RAM), a central processing unit (CPU), a graphics processing unit (GPU), and/or a modem.

The second device 120 may correspond to a volatile memory device. The volatile memory device may include RAM, dynamic RAM (DRAM), or static RAM (SRAM) but is not limited thereto. For example, the second device 120 may correspond to double data rate Synchronous DRAM (DDR SDRAM), low power DDR (LPDDR) SDRAM, graphics DDR (GDDR) SDRAM, Rambus DRAM (RDRAM), or the like. Alternatively, the second device 120 may correspond to high bandwidth memory (HBM).

Alternatively, the second device 120 may include a non-volatile memory device. For example, the second device 120 may include resistive-type memory, such as phase-change RAM (PRAM), magnetic RAM (MRAM), or resistive RAM (RRAM). Hereinafter, for convenience of description, the first device 110 may be referred to as a memory controller 110, and the second device 120 may be referred to as a memory device 120. Although the memory device 120 is illustrated as a single semiconductor chip, there may actually be "n" memory devices ("n" is a non-zero whole number).

The memory device 120 may be coupled to a channel 130 that includes a plurality of command/address buses, data buses, and clock buses. Hereinafter, the channel 130 may be interchangeably referred to as a command/address bus 130, a data bus 130, and a clock bus 130. The memory controller 110 and the memory device 120 may communicate with each other through various buses. For example, a command and address signal CA may be received by the memory device 120 through the command/address bus 130, and data (DQ) may be exchanged between the memory controller 110 and the memory device 120 through the data bus 130. Various clock signals may be provided between the memory controller 110 and the memory device 120 through the clock bus 130. The clock bus 130 may include signal lines for providing system clock signals CK_t and CK_c received by the memory device 120, data clock signals WCK_t and WCK_c received by the memory device 120, and a read clock signal provided to the memory controller 110 by the memory device 120. Each bus 130 may include at least one signal line to which a signal is provided.

The system clock signals CK_t and CK_c provided to the memory device 120 by the memory controller 110 may be used for the timing of providing and receiving a command and an address. The data clock signals WCK_t and WCK_c may be used for the timing of providing data. The system clock signals CK_t and CK_c may be complementary to each other, and the data clock signals WCK_t and WCK_c may be complementary to each other. When a rising edge of a first clock signal coincides with a falling edge of a second clock signal and a rising edge of the second clock signal coincides with a falling edge of the first clock signal, the first clock signal is complementary to the second clock signal.

The data clock signals WCK_t and WCK_c provided to the memory device 120 by the memory controller 110 may be synchronized with the system clock signals CK_t and CK_c provided to the memory device 120 by the memory controller 110. The data clock signals WCK_t and WCK_c may have a higher clock frequency than the system clock signals CK_t and CK_c. For example, the clock frequency of the data clock signals WCK_t and WCK_c may be four times the clock frequency of the system clock signals CK_t and CK_c. For convenience of description, the system clock signals CK_t and CK_c may be collectively referred to as a CK signal, and the data clock signals WCK_t and WCK_c may be collectively referred to as a WCK signal.

The memory controller 110 may provide a command to the memory device 120 to perform a memory operation. As a non-limiting example, memory commands may include a timing command for controlling timings of various operations, access commands for memory access, such as a read command for performing a read operation and a write command for performing a write operation, a mode register write and/or read command for performing a mode register write and/or read operation, and other commands for performing other operations.

When a read command and a related address are provided to the memory device 120 by the memory controller 110, the memory device 120 may receive the read command and the related address and perform a read operation, thereby outputting read DQ from a memory position corresponding to the related address. The read DQ may be provided to the memory controller 110 by the memory device 120 according to timing related to the reception of the read command. For example, the timing may be based on a read latency (RL) value, which indicates the number of cycles in the CK signal following the read command, when the read DQ is provided to the memory controller 110 by the memory device 120. The RL value may be programmed in the memory device 120 by the memory controller 110. For example, the RL value may be programmed in each mode register of the memory device 120. As is known, a mode register included in the memory device 120 may be programmed with information for various operation mode settings and/or selecting a characteristic for a memory operation. One of the settings may relate to the RL value.

When a write command and a related address are provided to the memory device 120 by the memory controller 110, the memory device 120 may receive the write command and the related address and perform a write operation, thereby writing write DQ from the memory controller 110 to a memory position corresponding to the related address. The write DQ may be provided to the memory device 120 by the memory controller 110 according to a timing related to the reception of the write command. For example, the timing may be based on a write latency (WL) value, which indicates the number of cycles in the CK signal following the write command, when the write DQ is provided to the memory device 120 by the memory controller 110. The WL value may be programmed in the memory device 120 by the memory controller 110. For example, the WL value may be programmed in a mode register of the memory device 120.

When preparing the memory device 120 receiving the write DQ from the memory controller 110, the memory controller 110 may provide an active WCK signal to the memory device 120. The WCK signal may be used by the memory device 120 to generate an internal clock signal for an operation timing of a circuit receiving the write DQ. The write DQ may be provided by the memory controller 110, the memory device 120 may receive the write DQ according to the WCK signal, and the write DQ may be written to memory corresponding to a memory address.

To accurately perform a memory operation according to operation timings, the memory controller 110 may include a training circuit 112, which performs memory training on the memory device 120. In response to a training command, the training circuit 112 may perform memory core parameter training associated with a memory core and/or peripheral circuit parameter training on a peripheral circuit other than the memory core in the memory device 120. The training circuit 112, as the subject of training, may determine an optimal parameter for a memory core parameter and/or a peripheral circuit parameter. Although it is described that the training circuit 112 is included in the memory controller 110, the training circuit 112 may be included in the memory device 120 in some embodiments such that the memory device 120 performs memory training as a subject.

The memory device 120 may include a mode register (MRS) 122, a data clock circuit 124, and a data input/output (I/O) circuit 126. To set an operating condition of the memory device 120, the MRS 122 may store information used to configure an operation of the memory device 120. The MRS 122 may store information for timing adjustment and monitoring of a WCK signal. For example, the MRS 122 may store information for timing adjustment of receiver offset calibration.

The data clock circuit 124 may perform duty cycle monitoring to monitor a duty of the WCK signal and provide a timing-adjusted WCK signal. The data clock circuit 124 may generate a timing-adjusted WCK signal based on a result of the duty cycle monitoring of the WCK signal. The data clock circuit 124 may provide the memory controller 110 with the result of the duty cycle monitoring of the WCK signal. The result of the duty cycle monitoring of the WCK signal may be provided to the memory controller 110 in response to a mode register read command issued by the memory controller 110.

According to some embodiments, the memory device 120 may provide a read data clock signal to the memory controller 110 for a timing of outputting read data to the memory controller 110. The data clock circuit 124 may perform duty cycle monitoring to monitor a duty of the read data clock signal and provide a timing-adjusted read data clock signal.

The data I/O circuit 126 may transmit, to the memory controller 110, the read DQ in synchronization with the timing-adjusted read data clock signal and may receive, from the memory controller 110, the write DQ in synchronization with the timing-adjusted WCK signal. DQ transmitted and received by the data I/O circuit 126 may include a data width of 8 bits. According to some embodiments, the data width may be 16 bits, which may be divided into a lower byte of 8-bit data and an upper byte of 8-bit data.

Figure 2:
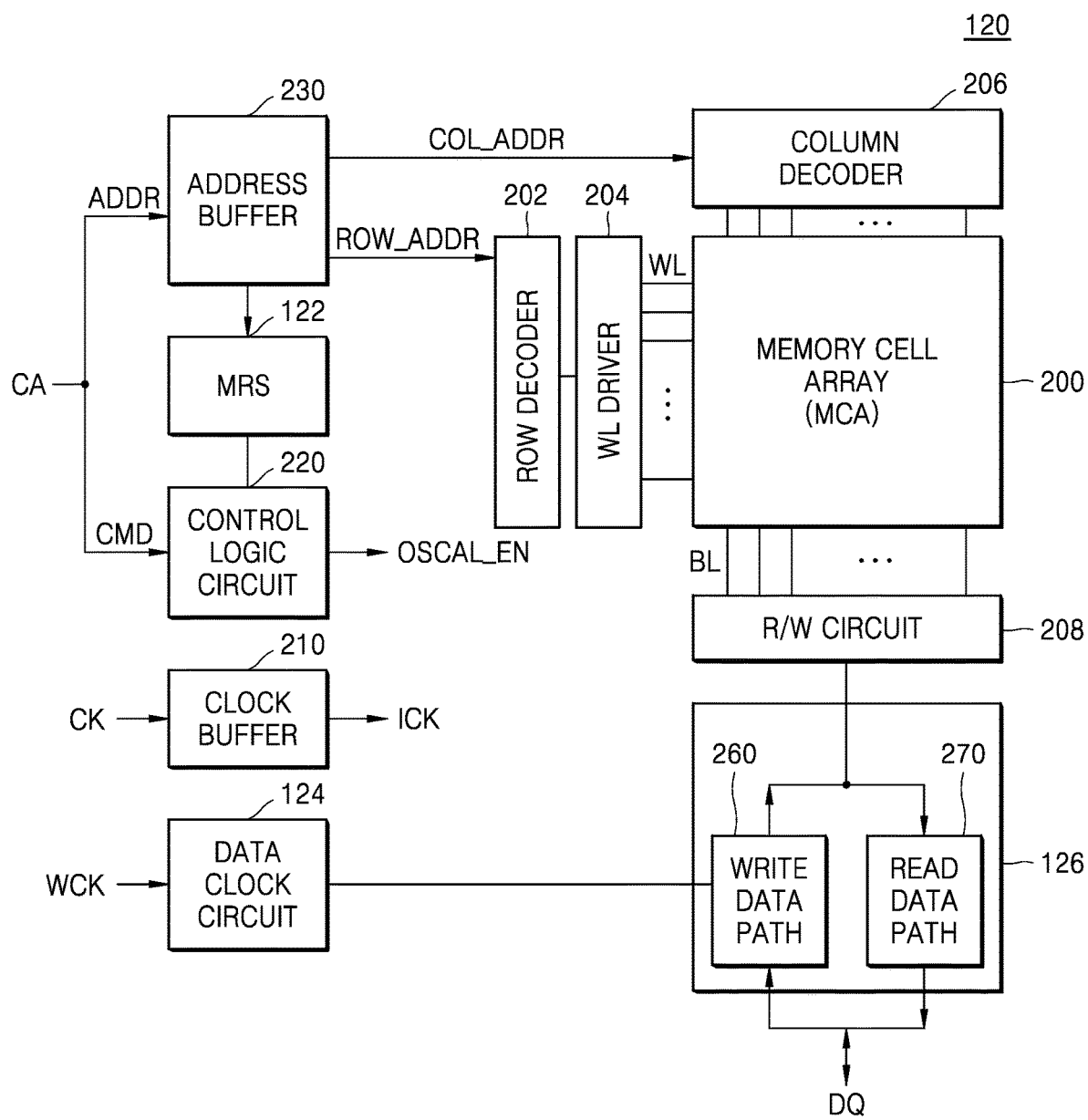
FIG. 2 is a block diagram of a memory device according to some embodiments.

FIG. 2 is a block diagram of the memory device 120 according to some embodiments.

Referring to FIGS. 1 and 2, the memory device 120 may include a memory cell array (MCA) 200, a row decoder 202, a word line driver 204, a column decoder 206, a read/write circuit 208, a clock buffer 210, a control logic circuit 220, an address buffer 230, the MRS 122, the data clock circuit 124, and the data I/O circuit 126.

The MCA 200 may include a plurality of memory cells arranged in a matrix of rows and columns. The MCA 200 may include a plurality of word lines WL respectively connected to the memory cells and a plurality of bit lines BL respectively connected to the memory cells. The word lines WL may be respectively connected to the rows of memory cells, and the bit lines BL may be respectively connected to the columns of memory cells.

The row decoder 202 may select one of the word lines WL connected to the MCA 200. The row decoder 202 may decode a row address ROW_ADDR received through the command/address bus 130 and the address buffer 230 and transmit a decoded row address to the word line driver 204. The word line driver 204 may select and activate a word line WL corresponding to the row address ROW_ADDR. The column decoder 206 may select some of the bit lines BL of the MCA 200. The column decoder 206 may decode a column address COL_ADDR received from the address buffer 230, generate a column selection signal, and connect bit lines BL selected by the column selection signal to the read/write circuit 208.

The read/write circuit 208 may include read data latches, which store read data of the bit lines BL selected by the column selection signal, and a write driver, which writes write data to the MCA 200. The read data stored in the read data latches of the read/write circuit 208 may be provided to the DQ bus 130 through a data output driver of a read data path 270. Write DQ may be transmitted to the MCA 200 through a data input buffer of a write data path 260 connected to the DQ bus 130 and through the write driver of the read/write circuit 208.

The clock buffer 210 may receive a CK signal and generate an internal clock signal ICK. The internal clock signal ICK may be provided to the control logic circuit 220 and used for various operation timings of internal circuits. The control logic circuit 220 may receive a command CMD through the command/address bus 130 and generate control signals for controlling the operation timings and/or memory operations of the memory device 120. The control logic circuit 220 may read data from the MCA 200 and write data to the MCA 200 by using the control signals.

To set an operating condition of the memory device 120, the MRS 122 may store information used by the control logic circuit 220 to configure operations of the memory device 120. The MRS 122 may include a register, which stores parameter code for various operation and control parameters used to set the operating condition of the memory device 120. The parameter code may be received by the memory device 120 through the command/address bus 130.

The MRS 122 may store information for timing adjustment of DQ receiver offset calibration. The MRS 122 may store a first parameter code for identifying whether a full-rate WCK signal is used for DQ receiver offset calibration or a second parameter code for identifying whether an oscillator signal OSC (see FIG. 5) at a low speed is supported for DQ receiver offset calibration. A data receiver offset calibration using a full-rate WCK signal may be referred to as a default DQ receiver offset calibration, and DQ receiver offset calibration supporting the oscillator signal OSC at a low speed may be referred to as an optional DQ receiver offset calibration.

The control logic circuit 220 may generate control signals provided to circuits of the memory device 120 such that the memory device 120 operates as set in operation and control parameters stored by the MRS 122. The control logic circuit 220 may generate an offset calibration control signal OSCAL_EN based on the information stored in the MRS 122 for the timing adjustment of receiver offset calibration. When a full-rate WCK signal is used for the default DQ receiver offset calibration, the control logic circuit 220 may set the offset calibration control signal OSCAL_EN to a logic low level, based on the first parameter code stored in the MRS 122. When the oscillator signal OSC at a low speed is supported for the optional DQ receiver offset calibration, the control logic circuit 220 may set the offset calibration control signal OSCAL_EN to a logic high level, based on the second parameter code stored in the MRS 122. Otherwise, when the oscillator signal OSC at a low speed is not supported for the optional DQ receiver offset calibration, the control logic circuit 220 may set the offset calibration control signal OSCAL_EN to the logic low level. The offset calibration control signal OSCAL_EN at the logic low level may be provided to set the DQ receiver offset calibration.

The data I/O circuit 126 may be divided into a portion of the write data path 260 including a data input buffer and a portion of the read data path 270 including a data output driver. The write data path 260 may include data input buffers receiving write DQ. The read data path 270 may include data output buffers transmitting read DQ.

The data clock circuit 124 may be configured to use a WCK signal in the case of the default DQ receiver offset calibration and use the oscillator signal OSC at a low speed in the case of the optional DQ receiver offset calibration. Before the optional DQ receiver offset calibration is performed, the data clock circuit 124 may generate an oscillator signal by using an oscillator.

Figure 3:
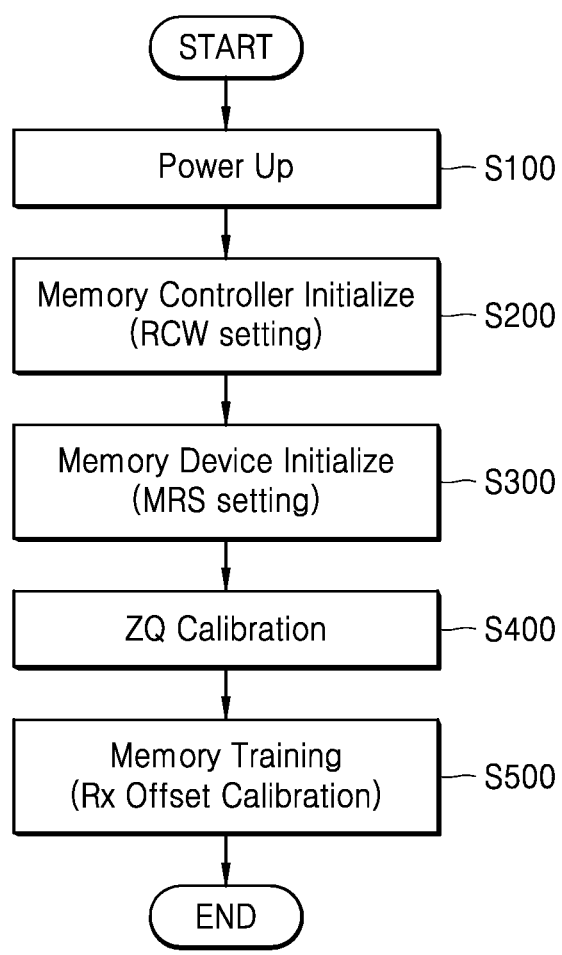
FIG. 3 is a flowchart of the power-up sequence of the apparatus of FIG. 1.

FIG. 3 is a flowchart of the power-up sequence of the apparatus 100 of FIG. 1.

Referring to FIGS. 1 and 3, electric power may be provided to the apparatus 100, and the apparatus 100 may be powered up in operation S100. When the apparatus 100 is powered up and the level of a power supply voltage VDD (see FIG. 6) driving the memory device 120 is stably maintained constant, the memory device 120 may be in an operable state. At this time, the memory device 120 may start a built-in self-test (BIST).

After the power-up of the apparatus 100, the memory controller 110 may set a register control word (RCW) to initialize the memory device 120 and/or control the memory device 120 according to the operating characteristics of the memory device 120 in operation S200. The RCW may include various algorithms, which configure the memory controller 110 such that the memory controller 110 may normally interoperate with the memory device 120. For example, code indicating the frequency, timing, driving, and detailed operation parameters of the memory device 120 and the like may be set in the RCW. Training of the memory device 120 may be performed according to the code of the RCW.

The memory device 120 may set the MRS 122, which sets a plurality of operation options, various functions, characteristics, and modes of the memory device 120, in operation S300. The MRS 122 may be used to control a burst length, column address strobe (CAS) latency, write leveling enable/disable, DQ terminal reference voltage (VrefDQ) training, and the like. The burst length may be provided to set the maximum number of accessible column locations for a read and/or write command. The CAS latency may be provided to define a clock cycle delay between a read command and the first bit of valid output data. Write leveling may be provided to enable or disable the compensation of skew between a CK signal and a WCK signal during a write operation. The VrefDQ training may be provided to set a reference voltage for reading data input to or output from DQ terminals. The VrefDQ training may be performed based on a data power supply voltage (VDDQ) driving I/O buffers connected to the DQ terminals.

The memory device 120 may receive an impedance adjustment (ZQ) calibration command from the memory controller 110 and perform ZQ calibration by using a ZQ engine in operation S400. The ZQ engine may generate a pull-up calibration code by performing pull-up calibration on ZQ resistance connected to a ZQ terminal and pull-up resistance of the ZQ engine and may generate a pull-down calibration code by performing pull-down calibration on the pull-up resistance and pull-down resistance of the ZQ engine. The pull-up calibration code and the pull-down calibration code may be provided to the I/O buffers. The I/O buffers may adjust a termination resistance value according to the pull-up calibration code and the pull-down calibration code.

After the ZQ calibration is performed in operation S400, memory training may be performed on the memory device 120 in operation S500. For example, the memory training may include clock training related to a write operation of the memory device 120, write leveling, write deskewing, write centering, data receiver offset calibration, or the like.

The clock training may allow the memory device 120 to accurately capture command and address signals, which are transmitted from the memory controller 110 based on a CK signal, or a command and address pattern. The clock training may also allow the memory device 120 to accurately capture write DQ, which is transmitted from the memory controller 110 based on a WCK signal. The write leveling may allow the memory device 120 to sample a WCK signal from the memory controller 110 based on a CK signal, detect a phase relationship between the CK signal and the WCK signal, and adjust the latency of the WCK signal.

The write deskewing may allow the memory device 120 to reduce a data input time difference between pieces of DQ, which are transmitted from the memory controller 110 through the DQ bus 130. Because a valid data window decreases when skew between pieces of write DQ increases in a write mode, the memory device 120 may perform write data deskewing that compensates for data skew in order to secure a valid data margin. According to some embodiments, because a valid data window decreases when skew between pieces of read DQ increases in a read mode, the memory device 120 may perform read data deskewing that compensates for data skew in order to secure a valid data margin.

The write centering may allow the memory device 120 to center an edge of a WCK signal in a write DQ window with respect to write DQ transmitted from the memory controller 110 through the DQ bus 130. According to some embodiments, the memory device 120 may be trained to center an edge of a read DQ clock signal in a read DQ window with respect to read DQ transmitted to the memory controller 110 in a read mode.

The DQ receiver offset calibration may include default DQ receiver offset calibration using a write data clock signal and optional DQ receiver offset calibration using the oscillator signal OSC. The DQ receiver offset calibration is described in detail with reference to FIG. 4 below.

After the completion of the memory training, the memory device 120 may store optimized operation parameters in a parameter storage region. For example, the parameter storage region may include an extended mode register set (EMRS), a separate parameter register unit, or non-volatile memory, such as flash memory, electrically programmable read-only memory (EPROM), or electrically erasable and programmable ROM (EEPROM). The memory device 120 may write or read data in an environment set to the optimized operation parameters in the parameter storage region.

Figure 4:
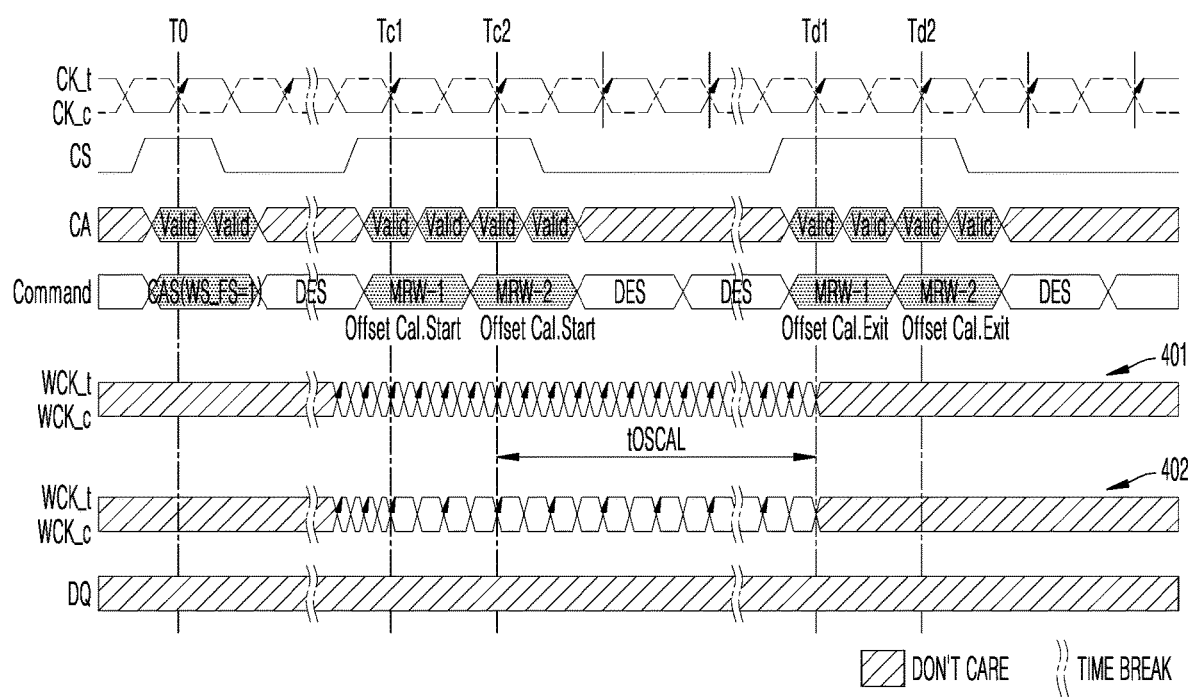
FIG. 4 is timing diagram illustrating an example of a data receiver offset calibration operation.

FIG. 4 is timing diagram illustrating an example of a DQ receiver offset calibration operation. The DQ receiver offset calibration operation of FIG. 4 may be performed to adjust an offset in an input stage of a sense amplifier-based flip-flop (SAFF) (see FIG. 6). It should be noted that, in the timing diagrams described in the embodiments below, the horizontal and vertical axes respectively indicate time and a voltage level and are not necessarily shown in a certain ratio.

Referring to FIG. 4, at a time point T0, a command "CAS(WS_FS=1)" may be issued for synchronization between a WCK signal and a CK signal. After the command "CAS(WS_FS=1)", the WCK signal may toggle at a full rate. The memory device 120 may support various data rates, e.g., 1600 Mbps, 2400 Mbps, 3200 Mbps, 6400 Mbps, and 7500 Mbps.

To start offset calibration training, commands MRW-1 and MRW-2 may be issued at time points Tc1 and Tc2, respectively. Thereafter, offset calibration may be performed during a tOSCAL time. To end the offset calibration training, commands MRW-1 and MRW-2 may be issued at time points Td1 and Td2, respectively. The tOSCAL time may be defined as a receiver offset calibration training time defined in the memory device 120. The tOSCAL time may be set to be long enough to perform offset calibration, for example, to about several □s.

Because of the demand for a high data rate, it is difficult to accurately capture DQ transmitted between the memory controller 110 and the memory device 120 at a high clock frequency. Moreover, because of a high-speed WCK signal, an SAFF associated with the default DQ receiver offset calibration does not have sufficient voltage development time for a sensing operation, and therefore, the output of the SAFF may not be normally output.

In the timing diagram of FIG. 4, when a high-speed WCK signal toggles at a full rate during the tOSCAL time, as shown in a waveform 401, the SAFF may deviate from an ideal offset calibration operation and lead to an undesirable training result. Consequently, an offset value according to incorrect training may cause malfunction of the SAFF and/or undesired performance of the memory device 120. A system based on the memory device 120 may experience failure.

To optimize DQ receiver offset calibration, a WCK signal needs to have a relatively low clock frequency (a waveform 402) instead of a high full-rate clock frequency (the waveform 401) during the tOSCAL time. Optional DQ receiver offset calibration operations using the oscillator signal OSC at a low speed like the waveform 402 are described in detail in various embodiments below.

Figure 5:
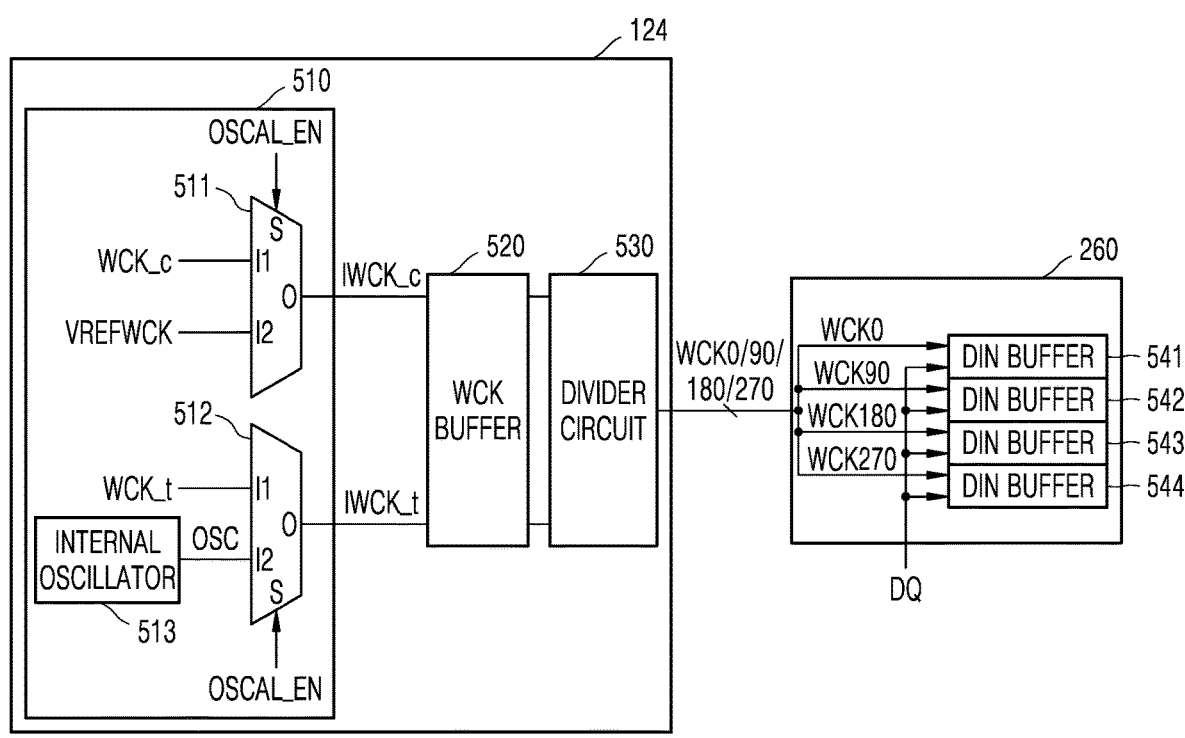
FIG. 5 is a diagram illustrating a data clock circuit according to some embodiments.
Figure 6:
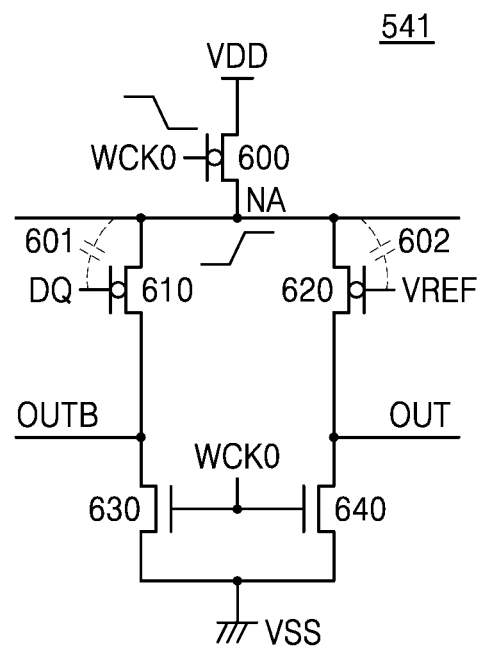
FIG. 6 is a circuit diagram illustrating a data input buffer according to some embodiments.

FIG. 5 is a diagram illustrating the data clock circuit 124 according to some embodiments. FIG. 6 is a circuit diagram illustrating a data input buffer (e.g., an SAFF) connected to the data clock circuit 124 in FIG. 5.

Referring to FIG. 5, the data clock circuit 124 may include an offset calibration controller 510, a clock buffer 520, and a divider circuit 530. The offset calibration controller 510 may selectively output first and second internal WCK signals IWCK_c and IWCK_t at a high speed or a low speed based on the offset calibration control signal OSCAL_EN provided from the control logic circuit 220 (see FIG. 2). The offset calibration controller 510 may include a first selector 511, a second selector 512, and an internal clock generator 513. The internal clock generator 513 may include an oscillator, which outputs the oscillator signal OSC, and may be configured to generate the oscillator signal OSC at a low speed like the waveform 402 described with reference to FIG. 4.

The first selector 511 may have a first input I1, which receives the data clock signal WCK_c provided to the memory device 120 by the memory controller 110, a second input I2, which receives a reference voltage VREFWCK, a third input S, which receives the offset calibration control signal OSCAL_EN, and an output O, which outputs the first internal WCK signal IWCK_c. The first selector 511 may select and output, as the first internal WCK signal IWCK_c, one of the data clock signal WCK_c or the reference voltage VREFWCK in response to the offset calibration control signal OSCAL_EN, which is provided by the control logic circuit 220 in FIG. 2.

The second selector 512 may have a first input I1, which receives the data clock signal WCK_t provided to the memory device 120 by the memory controller 110, a second input I2, which receives the oscillator signal OSC, and an output O, which outputs the second internal WCK signal IWCK_t. The second selector 512 may select and output, as the second internal WCK signal IWCK_t, one of the data clock signal WCK_t or the oscillator signal OSC in response to the offset calibration control signal OSCAL_EN.

When the default DQ receiver offset calibration is performed, the offset calibration controller 510 may output the data clock signal WCK_c of the first input I1 of the first selector 511 as the first internal WCK signal IWCK_c and output the data clock signal WCK_t of the first input I1 of the second selector 512 as the second internal WCK signal IWCK_t, in response to the offset calibration control signal OSCAL_EN at a logic low level.

When the optional DQ receiver offset calibration using the oscillator signal OSC at a low speed is performed, the offset calibration controller 510 may output the reference voltage VREFWCK of the second input I2 of the first selector 511 as the first internal WCK signal IWCK_c and output the oscillator signal OSC of the second input I2 of the second selector 512 as the second internal WCK signal IWCK_t, in response to the offset calibration control signal OSCAL_EN at a logic high level.

The clock buffer 520 may buffer the first internal WCK signal IWCK_c and the second internal WCK signal IWCK_t and provide buffered first and second WCK signals to the divider circuit 530. The first internal WCK signal IWCK_c may be complementary to the second internal WCK signal IWCK_t. For convenience of description, the first internal WCK signal IWCK_c and the second internal WCK signal IWCK_t may be referred to as IWCK signals.

The divider circuit 530 may provide multi-phase clock signals derived from the IWCK signals. The multi-phase clock signals may have a phase relationship with each other. For example, the divider circuit 530 may generate four internal clock signals WCK0, WCK90, WCK180, and WCK270, which have a phase relationship of 90 degrees (0 degrees, 90 degrees, 180 degrees, and 270 degrees) with each other (e.g., a 90-degree phase relationship therebetween). The internal clock signals WCK0 and WCK180 may have a phase difference of 180 degrees therebetween, and the internal clock signals WCK90 and WCK270 may have a phase difference of 180 degrees therebetween. For convenience of description, the four internal clock signals WCK0, WCK90, WCK180, and WCK270 may interchangeably be used with a multi-phase clock signal. Embodiments are not limited to a certain number of internal clock signals, a certain phase relationship, and/or a certain clock frequency.

The multi-phase clock signal (WCK0, WCK90, WCK180, and WCK270) may be provided to the write data path 260 of the data I/O circuit 126 (see FIGS. 1 and 2) by a clock tree and driver circuit for the timing of an operation of receiving write DQ from the memory controller 110. With respect to data having a data width including a lower byte and an upper byte, the data clock circuit 124 may provide separate clock paths respectively for the internal clock signals WCK0, WCK90, WCK180, and WCK270 related with each byte. For convenience of description, the data clock circuit 124 may be assumed to provide the internal clock signals WCK0, WCK90, WCK180, and WCK270 with respect to a single piece of DQ and to be associated with a DQ receiver offset calibration operation.

The internal clock signals WCK0, WCK90, WCK180, and WCK270 may be provided to the write data path 260 receiving write DQ. The write data path 260 may include first to fourth data input buffers 541, 542, 543, and 544, which receive the internal clock signals WCK0, WCK90, WCK180, and WCK270, respectively, and write DQ. For example, the internal clock signals WCK0, WCK90, WCK180, and WCK270 may be respectively provided to the first to fourth data input buffers 541, 542, 543, and 544. The first data input buffer 541 may receive the internal clock signal WCK0 and the write DQ, the second data input buffer 542 may receive the internal clock signal WCK90 and the write DQ, the third data input buffer 543 may receive the internal clock signal WCK180 and the write DQ, and the fourth data input buffer 544 may receive the internal clock signal WCK270 and the write DQ. Each of the first to fourth data input buffers 541, 542, 543, and 544 may be implemented by a SAFF illustrated in FIG. 6. FIG. 6 shows the SAFF configuration of the first data input buffer 541 among the first to fourth data input buffers 541, 542, 543, and 544. The SAFF configuration of the first data input buffer 541 may also be applied to the other second to fourth data input buffers 542, 543, and 544.

FIG. 6 shows the input stage of the SAFF. The first data input buffer 541 may compare write DQ with a reference voltage VREF and output first and second output signals OUT and OUTB. The input stage of the SAFF may include P-type metal oxide semiconductor (PMOS) transistors 610 and 620 respectively receiving the write DQ and the reference voltage VREF, a PMOS transistor 600 receiving the internal clock signal WCK0, and N-type MOS (NMOS) transistors 630 and 640 receiving the internal clock signal WCK0. The PMOS transistor 600 may be connected between a line of a power supply voltage VDD and a connection node NA of the PMOS transistors 610 and 620. The NMOS transistor 630 may be connected between the PMOS transistor 610 and a line of a ground voltage VSS. The NMOS transistor 640 may be connected between the PMOS transistor 620 and the line of the ground voltage VSS. The first output signal OUT of the SAFF may be output from a connection node between the PMOS transistor 620 and the NMOS transistor 640, and the second output signal OUTB of the SAFF may be output from a connection node between the PMOS transistor 610 and the NMOS transistor 630.

In the first data input buffer 541, the internal clock signal WCK0 input to the PMOS transistor 600 and the NMOS transistors 630 and 640 may be the same as the high-speed full-rate data clock signals WCK_c and WCK_t in the case of default DQ receiver offset calibration and may be the same as the low-speed oscillator signal OSC, which is output from the internal clock generator 513 (see FIG. 5), in the case of optional DQ receiver offset calibration. The SAFF may perform a sensing operation for a more sufficient voltage development time in the case of optional DQ receiver offset calibration using the low-speed oscillator signal OSC than in the case of default DQ receiver offset calibration. Accordingly, the first output signal OUT and the second output signal OUTB of the first data input buffer 541 may be normally output.

In the input stage of the SAFF of FIG. 6, there may be an input offset because of the difference between the PMOS transistor 610 and a path for receiving the write DQ and the PMOS transistor 620 and a path for receiving the reference voltage VREF. In addition, kickback noise may occur because of parasitic capacitance 601 between the connection node NA among the PMOS transistors 600, 610, and 620 and a gate terminal of the PMOS transistor 610 receiving the write DQ, and parasitic capacitance 602 between the connection node NA among the PMOS transistors 600, 610, and 620 and a gate terminal of the PMOS transistor 620 receiving the reference voltage VREF. The input offset and/or the kickback noise makes it difficult to adjust DQ receiver offset calibration.

Figure 7A:
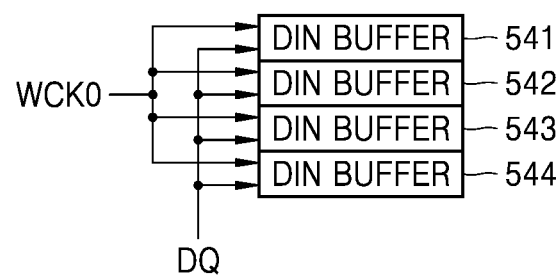
FIGS. 7A, 7B, 8A, 8B, and 9 are diagrams illustrating the effects of a data clock circuit and a data input buffer, according to some embodiments.
Figure 7B:
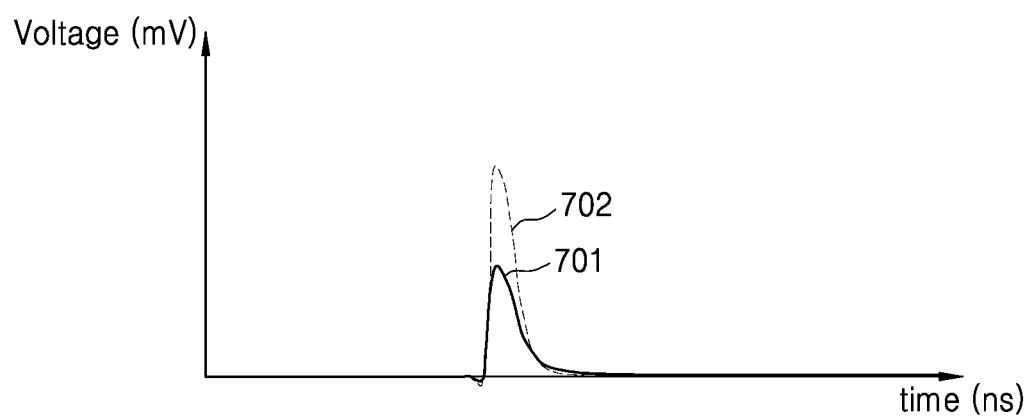
Figure 8A:
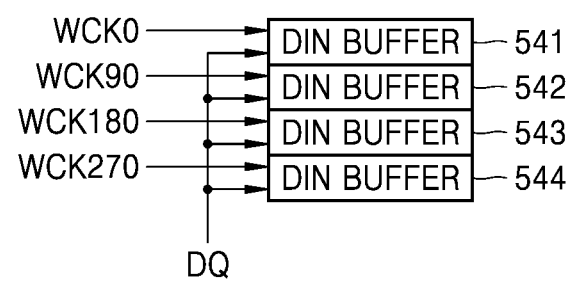
Figure 8B:
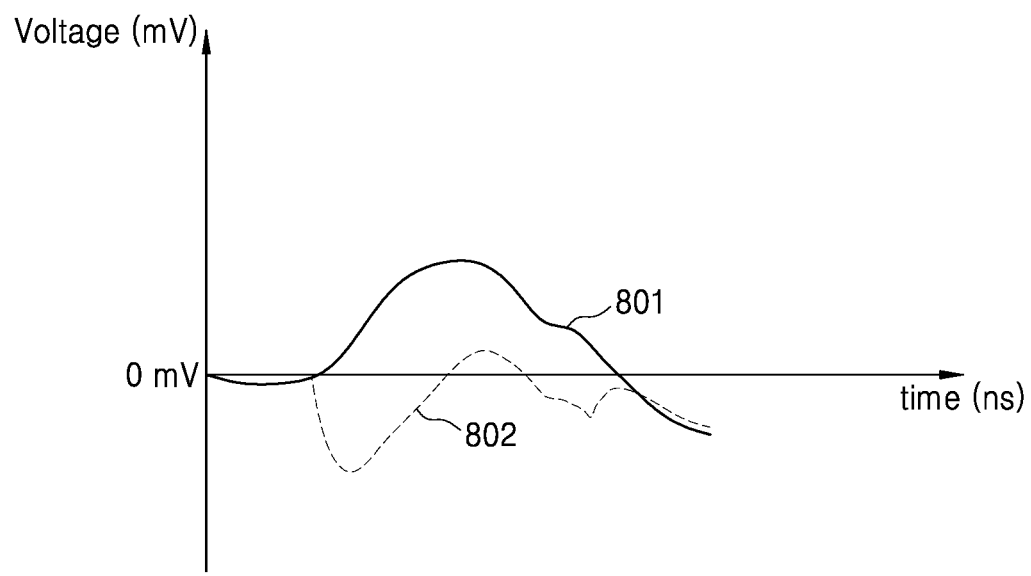
Figure 9:
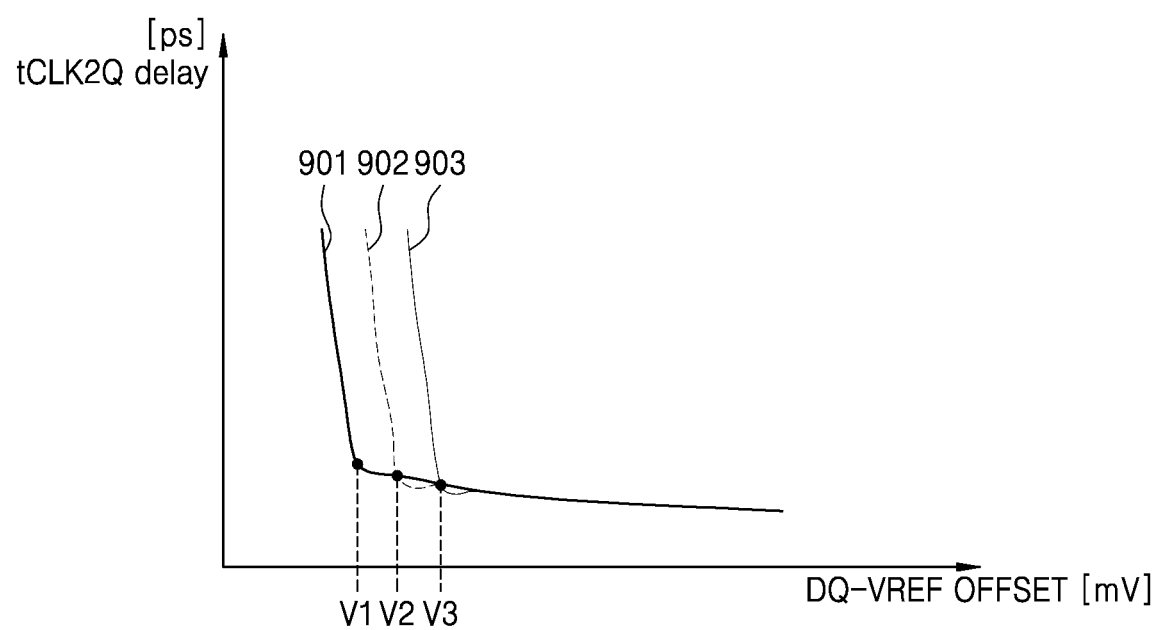

FIGS. 7A to 9 are diagrams illustrating the effects of a data input buffer connected to a data clock circuit, according to some embodiments. FIGS. 7A and 7B illustrate a kickback noise signal occurring in the SAFF input stage of each of the first to fourth data input buffers 541, 542, 543, and 544 in FIG. 5. FIGS. 8A and 8B illustrate the cancellation of the kickback noise signal in the SAFF input stage. FIG. 9 illustrates input offset values detected in the SAFF input stage.

Referring to FIGS. 5 to 7A, the first to fourth data input buffers 541, 542, 543, and 544, each of which is implemented by a SAFF, receive the internal clock signal WCK0 in common and perform DQ receiver offset calibration. When the internal clock signal WCK0 transits from a logic high level to a logic low level, the connection node NA may be made by the PMOS transistor 600 to transit from a logic low level to a logic high level. At this time, the first data input buffer 541 may receive a kickback noise signal that is distorted (or coupled) like a waveform 701 in FIG. 7B, in correspondence to the internal clock signal WCK0, at the respective gate terminals of the PMOS transistors 610 and 620 due to the parasitic capacitances 601 and 602, respectively. The third data input buffer 543 may receive a kickback noise signal that is more distorted (or coupled) like a waveform 702 in FIG. 7B, in correspondence to the internal clock signal WCK0, at the respective gate terminals of the PMOS transistors 610 and 620 due to the parasitic capacitances 601 and 602, respectively. Although not shown, in the input stage of each of the second data input buffer 542 and the fourth data input buffer 544, each of the second data input buffer 542 and the fourth data input buffer 544 may receive a kickback noise signal that is more distorted (or coupled) like the waveform 702 in FIG. 7B in correspondence to the internal clock signal WCK0.

Referring to FIG. 8A, the first to fourth data input buffers 541, 542, 543, and 544 respectively receive the internal clock signals WCK0, WCK90, WCK180, and WCK270 in their input stages and perform DQ receiver offset calibration. At this time, the first data input buffer 541 may receive a kickback noise signal that is distorted (or coupled) like a waveform 801 in FIG. 8B, in correspondence to the internal clock signal WCK0, at the respective gate terminals of the PMOS transistors 610 and 620 due to the parasitic capacitances 601 and 602, respectively. The third data input buffer 543 may receive a kickback noise signal that is distorted (or coupled) like a waveform 802 in FIG. 8B, in correspondence to the internal clock signal WCK180, at the respective gate terminals of the PMOS transistors 610 and 620 due to the parasitic capacitances 601 and 602, respectively. Because the internal clock signal WCK0 has an opposite phase to the internal clock signal WCK180, the kickback noise of the first data input buffer 541 and the kickback noise of the third data input buffer 543 may be offset by the waveforms 801 and 802 having opposite phases to each other. Although not shown, in the input stage of each of the second data input buffer 542 and the fourth data input buffer 544, a kickback noise signal may be offset by the waveform 801 corresponding to the internal clock signal WCK90 or the waveform 802 corresponding to the internal clock signal WCK270.

FIG. 9 shows results (e.g., waveforms 901, 902, and 903) of DQ receiver offset calibration performed by the data clock circuit 124 in conjunction with the first to fourth data input buffers 541, 542, 543, and 544. In the graph of FIG. 9, the vertical axis is a delay time tCLK2Q between a WCK signal and each of the first and second output signals OUT and OUTB in the SAFF input stage, and the horizontal axis is an input offset value between DQ and reference voltage VREF. The waveform 901 shows an input offset value V1, which is detected when a WCK signal has a low frequency (e.g., 100 Mbps) in default DQ receiver offset calibration. The waveform 902 shows an input offset value V2, which is detected when a WCK signal has a high frequency (e.g., 6400 Mbps) in DQ receiver offset calibration using the oscillator signal OSC of the internal clock generator 513, and the waveform 903 shows an input offset value V3, which is detected when a WCK signal has a high frequency (e.g., 7400 Mbps) in the DQ receiver offset calibration using the oscillator signal OSC. It may be seen in FIG. 9 that the input offset values V2 and V3 may be detected because the oscillator signal OSC at a low speed is used with respect to even high-frequency WCK signals (e.g., a 6400-Mbps WCK signal and a 7400-Mbps WCK signal).

Figure 10:
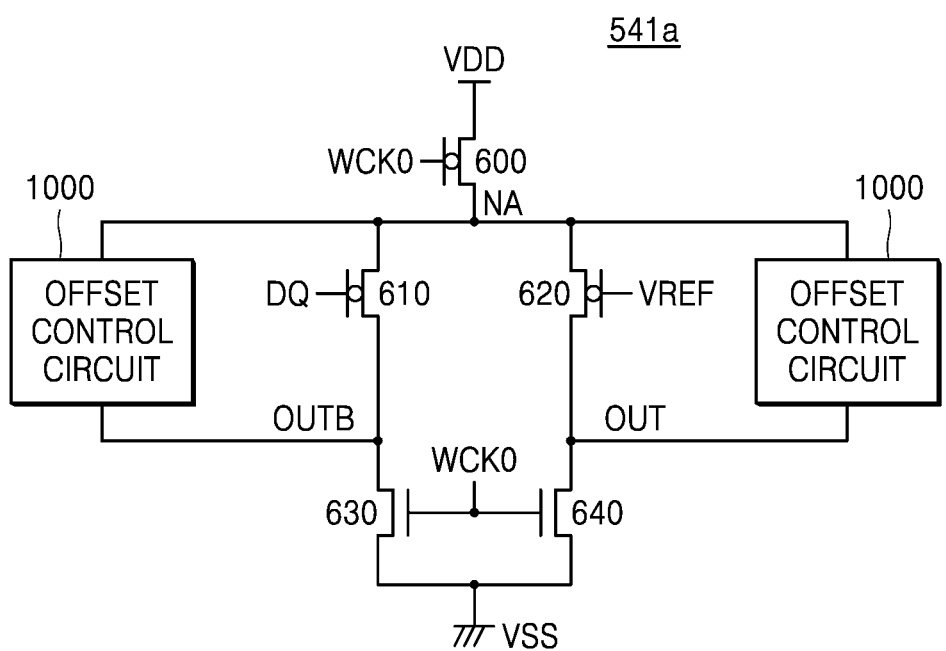
FIG. 10 is a circuit diagram illustrating a data input buffer according to some embodiments.

FIG. 10 is a circuit diagram illustrating a data input buffer according to some embodiments. Hereinafter, a suffix of a reference numeral (e.g., "a" in 541a) is used to distinguish from other circuits having the same functions.

Referring to FIG. 10, a data input buffer 541a is different from the first data input buffer 541 of FIG. 6 in that the data input buffer 541a further includes an offset control circuit 1000. The offset control circuit 1000 may be connected between the line of the first output signal OUT and the connection node NA between the PMOS transistors 610 and 620 and between the line of the second output signal OUTB and the connection node NA. The offset control circuits 1000 may control such that an offset value detected in default DQ receiver offset calibration or optional DQ receiver offset calibration is compensated for. Accordingly, an input offset between a path for receiving write DQ and the PMOS transistor 610 and an input offset between a path for receiving the reference voltage VREF and the PMOS transistor 620 may be removed.

Figure 11:
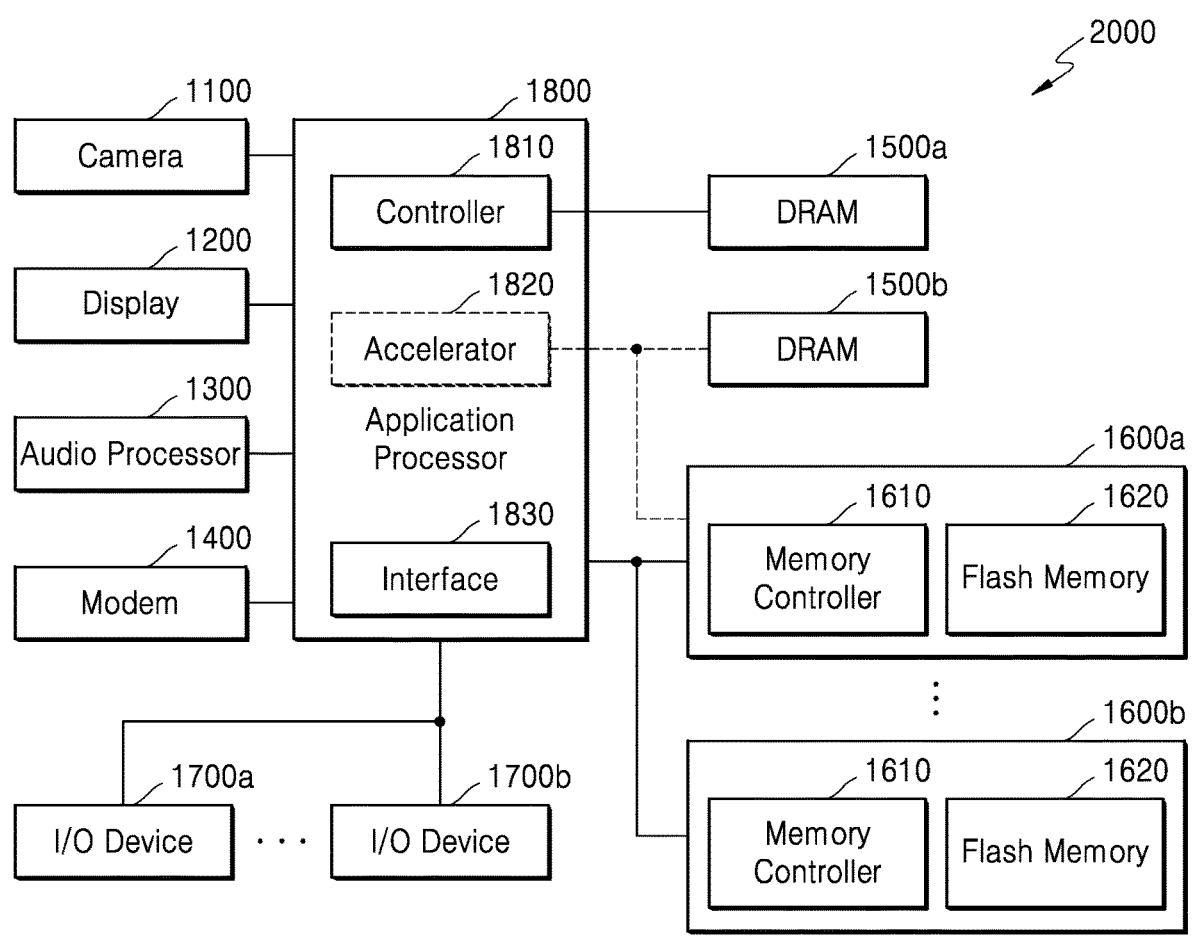
FIG. 11 is a block diagram of a system for describing an electronic equipment including a memory device, according to some embodiments.

FIG. 11 is a block diagram of a system 2000 for describing an electronic equipment including a memory device, according to some embodiments.

Referring to FIG. 11, the system 2000 may include a camera 1100, a display 1200, an audio processor 1300, a modem 1400, DRAMs 1500a and 1500b, flash memories 1600a and 1600b, I/O devices 1700a and 1700b, and an AP 1800. The system 2000 may be implemented as a laptop computer, a mobile phone, a smartphone, a tablet PC, a wearable device, a healthcare device, or an IoT device. The system 2000 may be implemented as a server or a PC.

The camera 1100 may shoot a still image or a video under a user's control and store image/video data or transmit the image/video data to the display 1200. The audio processor 1300 may process audio data included in the contents of the flash memories 1600a and 1600b or a network. For wired/wireless data communication, the modem 1400 modulates a signal, transmits a modulated signal, and demodulates a received signal to restore an original signal. The I/O devices 1700a and 1700b may include devices, such as a universal serial bus (USB) storage, a digital camera, a secure digital (SD) card, a digital versatile disc (DVD), a network adapter, and a touch screen, which provide digital input and/or output functions.

The AP 1800 generally controls operations of the system 2000. The AP 1800 may include a controller 1810, an accelerator block or an accelerator chip 1820, and an interface block 1830. The AP 1800 may control the display 1200 to display some of the contents stored in the flash memories 1600a and 1600b. When the AP 1800 receives user input through the I/O devices 1700a and 1700b, the AP 1800 may perform a control operation corresponding to the user input. The AP 1800 may include the accelerator block, which is a dedicated circuit for artificial intelligence (AI) data operations, or an accelerator chip 1820 may be provided separately from the AP 1800. The DRAM 1500b may be additionally mounted on the accelerator block or the accelerator chip 1820. The accelerator 1820 is a functional block that specially performs a certain function of the AP 1800 and may include a GPU that is a functional block specially performing graphics data processing, a neural processing unit (NPU) that is a functional block specially performing AI calculation and inference, and a data processing unit (DPU) that is a functional block specially performing data transmission.

The system 2000 may include the DRAMs 1500a and 1500b. The AP 1800 may control the DRAMs 1500a and 1500b through commands and MRS setting, which comply with Joint Electron Device Engineering Council (JEDEC) standards, or may set a DRAM interface protocol and communicate with the DRAMs 1500a and 1500b to use a company's unique functions, such as low voltage, high speed, reliability, and a cyclic redundancy check (CRC) function, and/or an error correction code (ECC) function. For example, the AP 1800 may communicate with the DRAM 1500a through an interface, such as LPDDR4 or LPDDR5, complying with the JEDEC standards, and the accelerator block or the accelerator chip 1820 may set a new DRAM interface protocol and communicate with the DRAM 1500b to control the DRAM 1500b, which has a higher bandwidth than the DRAM 1500a for accelerators.

Although only the DRAMs 1500a and 1500b are illustrated in FIG. 11, embodiments are not limited thereto, and any type of memory, such as PRAM, SRAM, MRAM, RRAM, FRAM, or hybrid RAM, which satisfies the requirements of a bandwidth, a response speed, and/or a voltage for the AP 1800 or the accelerator chip 1820, may be used. The DRAMs 1500a and 1500b have relatively less latency and bandwidth than the I/O devices 1700a and 1700b or the flash memory devices 1600a and 1600b. The DRAMs 1500a and 1500b may be initialized when the system 2000 is powered on and may be loaded with an operating system (OS) and application data to be used as a temporary storage of the OS and the application data or may be used as a space for execution of various kinds of software code.

The four fundamental arithmetic operations, i.e., addition, subtraction, multiplication, and division, vector operations, address operations, or fast Fourier transform (FFT) operations may be performed in the DRAMs 1500a and 1500b. Functions for executions used for inference may also be performed in the DRAMs 1500a and 1500b. At this time, the inference may be performed during a deep learning algorithm using an artificial neural network. The deep learning algorithm may include a training phase, in which a model is trained using various data, and an inference phase, in which data is recognized using the trained model. In some embodiments, an image shot by a user through the camera 1100 may undergo signal processing and may be stored in the DRAM 1500b, and the accelerator block or the accelerator chip 1820 may perform an AI data operation using data stored in the DRAM 1500b and a function used for inference to recognize the data.

The system 2000 may include a plurality of storages or the flash memory devices 1600a and 1600b, which have a larger capacity than the DRAMs 1500a and 1500b. The accelerator or the accelerator chip 1820 may perform a training phase and an AI data operation using the flash memory devices 1600a and 1600b. In some embodiments, each of the flash memories 1600a and 1600b may include a memory controller 1610 and flash memory device 1620 and may allow the AP 1800 and/or the accelerator chip 1820 to efficiently perform a training phase and an inference AI data operation using an arithmetic unit included in the memory controller 1610. The flash memories 1600a and 1600b may store images shot through the camera 1100 or data received from a data network. For example, the flash memories 1600a and 1600b may store augmented and/or virtual reality contents, high definition (HD) contents, or ultra-high definition (UHD) contents.

In the system 2000, the DRAMs 1500a and 1500b may include a memory device described with reference to FIGS. 1 to 10. The memory device may be configured to set default DQ receiver offset calibration using a write data clock signal or optional DQ receiver offset calibration using an oscillator signal. When the optional DQ receiver offset calibration is performed, the memory device may be configured to compare a reference voltage with data in an input stage of an SAFF in response to a multi-phase clock signal (e.g., first to fourth internal clock signals having a 90-degree phase relationship therebetween) derived from the oscillator signal and may thus detect an input offset value and offset kickback noise.

As used herein, the terms "comprises", "comprising", "includes", "including", "has", "having" and any other variations thereof specify the presence of the stated features, integers, steps, operations, elements, and/or components, but do not preclude the presence or addition of one or more other features, integers, steps, operations, elements, components, and/or groups thereof.

While the inventive concept has been particularly shown and described with reference to example embodiments thereof, it will be understood that various changes in form and details may be made therein without departing from the scope of the following claims.

What is claimed is:

1. A method of performing a data receiver offset calibration of a memory device, the method comprising:
storing a first parameter code in a mode register, the first parameter code being used to set a default data receiver offset calibration for the data receiver offset calibration;
storing a second parameter code in the mode register, the second parameter code being used to set an optional data receiver offset calibration for the data receiver offset calibration;
training the default data receiver offset calibration based on the first parameter code for the data receiver offset calibration; and
training the optional data receiver offset calibration based on the second parameter code for the data receiver offset calibration.

2. The method of claim 1, further comprising selecting one of the first parameter code or the second parameter code to set the data receiver offset calibration.

3. The method of claim 1, wherein the default data receiver offset calibration uses a write data clock signal provided to the memory device.

4. The method of claim 3, wherein the optional data receiver offset calibration uses an oscillator signal.

5. The method of claim 4, wherein the oscillator signal has a lower clock frequency than the write data clock signal.

6. The method of claim 5, further comprising generating the oscillator signal by using an internal clock generator of the memory device before performing the optional data receiver offset calibration, during the training of the optional data receiver offset calibration.

7. The method of claim 4, further comprising generating a multi-phase clock signal derived from the oscillator signal by using a divider circuit of the memory device, during the training of the optional data receiver offset calibration,
wherein the multi-phase clock signal includes first to fourth internal clock signals having a 90-degree phase relationship therebetween.

8. The method of claim 7, further comprising respectively providing the first to fourth internal clock signals to first to fourth data input buffers, the first to fourth data input buffers receiving data provided to the memory device,
wherein each of the first to fourth data input buffers includes a sense amplifier-based flip-flop (SAFF) configured to compare a reference voltage with the data in response to receiving one of the first to fourth internal clock signals.

9. The method of claim 1, further comprising compensating for an offset value detected in one of the default data receiver offset calibration or the optional data receiver offset calibration.

10. A memory device comprising:
a mode register configured to store one of a first parameter code or a second parameter code for a data receiver offset calibration, wherein the first parameter code is used to set a default data receiver offset calibration, and the second parameter code is used to set an optional data receiver offset calibration; and an internal clock generator that includes an oscillator configured to generate an oscillator signal, wherein the memory device is configured to perform the default data receiver offset calibration by using a write data clock signal and perform the optional data receiver offset calibration by using the oscillator signal.

11. The memory device of claim 10, wherein the oscillator signal has a lower clock frequency than the write data clock signal.

12. The memory device of claim 10, further comprising:
a control logic circuit configured to generate an offset calibration control signal based on one of the first parameter code or the second parameter code; and
a data clock circuit configured to generate a multi-phase clock signal in response to the offset calibration control signal,
wherein the multi-phase clock signal is derived from the oscillator signal, and
wherein the multi-phase clock signal includes first to fourth internal clock signals that have a 90-degree phase relationship therebetween.

13. The memory device of claim 12, further comprising first to fourth data input buffers electrically connected to the data clock circuit and configured to receive data provided to the memory device,
wherein each of the first to fourth data input buffers includes a sense amplifier-based flip-flop (SAFF) configured to compare a reference voltage with the data.

14. The memory device of claim 13, wherein each of the first to fourth data input buffers is configured to perform the optional data receiver offset calibration in response to receiving one of the first to fourth internal clock signals, and
wherein the first to fourth data input buffers are configured to respectively receive the first to fourth internal clock signals.

15. The memory device of claim 10, wherein the memory device is configured to compensate for an offset value detected in one of the default data receiver offset calibration or the optional data receiver offset calibration.

16. A method of performing a data receiver offset calibration of a memory device, the method comprising:

storing a first parameter code in a mode register, the first parameter code being used to set a default data receiver offset calibration using a write data clock signal for the data receiver offset calibration;

storing a second parameter code in the mode register, the second parameter code being used to set an optional data receiver offset calibration using an oscillator signal for the data receiver offset calibration, the oscillator signal having a lower clock frequency than the write data clock signal;

training the default data receiver offset calibration based on the first parameter code for the data receiver offset calibration; and training the optional data receiver offset calibration based on the second parameter code for the data receiver offset calibration.

17. The method of claim 16, further comprising generating the oscillator signal by using an internal clock generator of the memory device before performing the optional data receiver offset calibration, during the training of the optional data receiver offset calibration.

18. The method of claim 17, further comprising generating a multi-phase clock signal derived from the oscillator signal by using a divider circuit of the memory device, during the training of the optional data receiver offset calibration,
wherein the multi-phase clock signal includes first to fourth internal clock signals having a 90-degree phase relationship therebetween.

19. The method of claim 18, further comprising respectively providing the first to fourth internal clock signals to first to fourth data input buffers, the first to fourth data input buffers receiving data provided to the memory device,
wherein the first to fourth data input buffers are configured to compare a reference voltage with the data in response to receiving the first to fourth internal clock signals, respectively.

20. The method of claim 16, further comprising compensating for an offset value detected in one of the default data receiver offset calibration or the optional data receiver offset calibration.

* * * * *